United States Patent [19]

Merchant et al.

[11] Patent Number: 5,693,561
[45] Date of Patent: Dec. 2, 1997

[54] METHOD OF INTEGRATED CIRCUIT FABRICATION INCLUDING A STEP OF DEPOSITING TUNGSTEN

[75] Inventors: Sailesh Mansinh Merchant; Leonard Jay Olmer; Ronald Joseph Schutz, all of Orlando, Fla.

[73] Assignee: Lucent Technologies Inc., Murray Hill, N.J.

[21] Appl. No.: 645,852

[22] Filed: May 14, 1996

[51] Int. Cl.$^6$ ................................. H01L 21/283
[52] U.S. Cl. .................. 437/190; 437/192; 437/195; 437/228
[58] Field of Search ....................... 437/189, 190, 437/192, 195, 228 ST; 257/751, 752, 763

[56] References Cited

U.S. PATENT DOCUMENTS

| | | | |
|---|---|---|---|
| 5,143,861 | 9/1992 | Turner | 437/52 |
| 5,164,330 | 11/1992 | Davis et al. | 437/192 |
| 5,175,126 | 12/1992 | Ho et al. | 437/190 |
| 5,183,782 | 2/1993 | Onishi et al. | 437/192 |
| 5,200,360 | 4/1993 | Bradbury et al. | 437/192 |
| 5,202,579 | 4/1993 | Fujii | 257/751 |
| 5,232,871 | 8/1993 | Ho | 437/190 |
| 5,232,873 | 8/1993 | Geva | 437/192 |
| 5,233,223 | 8/1993 | Murayama | 257/770 |
| 5,236,869 | 8/1993 | Takagi et al. | 437/190 |
| 5,244,534 | 9/1993 | Yu et al. | 156/636 |
| 5,260,232 | 11/1993 | Muroyama et al. | 437/187 |
| 5,312,775 | 5/1994 | Fujii et al. | 437/192 |
| 5,327,011 | 7/1994 | Iwamatsu | 257/750 |
| 5,552,339 | 9/1996 | Hsieh | 437/190 |

OTHER PUBLICATIONS

"Failure of Titanium Nitride Diffusion Barriers During Tungsten Chemical Vapor Deposition: Theory and Practice", Matthew Rutten et al., Conference Proceedings ULSI–VII, 1992 Materials Research Society.

*Primary Examiner*—T. N. Quach
*Attorney, Agent, or Firm*—John T. Rehberg

[57] ABSTRACT

Integrated circuit fabrication includes the formation of tungsten contacts in windows. Between the tungsten and the contact region are Ti and TiN layers. Defects are prevented or reduced by sealing grain boundaries in the TiN layer prior to tungsten deposition. Grain boundaries are sealed by rinsing the TiN layer in water at ambient temperature or above.

6 Claims, 1 Drawing Sheet

METHOD OF INTEGRATED CIRCUIT FABRICATION INCLUDING A STEP OF DEPOSITING TUNGSTEN

TECHNICAL FIELD

This invention relates generally to a method of integrated circuit fabrication that includes a step of tungsten deposition and particularly to such a method that includes a step that reduces the defect density of the deposited tungsten.

BACKGROUND OF THE INVENTION

Integrated circuits frequently form electrical contacts to components, such as field effect transistor, by depositing a dielectric layer over the transistor and then patterning the dielectric layer to form openings or windows which expose elements; for example, gate, source or drain, of the transistor. Metal is then deposited in the windows to form the contacts. As integrated circuits have increased in complexity, multilevel metallizations have been developed. In such metallizations, an electrical conductor, rather than a device element, is contacted. Aluminum was the metal initially used because of its good electrical characteristics and relative ease of handling. However, as device dimensions have shrunk, sputtered or physically vapor deposited (PVD) aluminum and its alloys (such as Al—Cu or Al—Si—Cu) have exhibited drawbacks, such as a tendency to form re-entrant angles, which make it difficult to obtain adequate filling of the window. Accordingly, alternatives to aluminum and its alloys have been sought.

One alternative that has been extensively investigated is tungsten. Tungsten may be deposited by a variety of techniques including chemical vapor deposition (CVD) which may be either a blanket or a selective deposition. CVD decomposes a tungsten-containing precursor gas, such as $WF_6$, and the tungsten is deposited on the surface. The blanket deposition of tungsten using $WF_6$ is the most common method of depositing CVD tungsten in the prior art. In the case of selective tungsten, a method not commonly used, tungsten is not deposited on dielectric surfaces but only on the conducting surfaces. CVD tungsten does not have either the re-entrant angles or poor step coverage exhibited by PVD aluminum. Tungsten is not generally deposited directly onto silicon, a dielectric, or aluminum. Typically, intermediate layers, such as Ti or TiN or combinations thereof, are present between the tungsten and the underlying layer for reasons of adhesion or barrier properties.

See, for example, U.S. Pat. No. 5,260,232 issued on Nov. 9, 1993 to Muroyama for description of a technique for filling windows by selective CVD tungsten. In some embodiments, Muroyama formed a TiN layer which functioned both as a barrier layer and as an adhesion layer. U.S. Pat. No. 5,202,579 issued on Apr. 13, 1993 to Fujii used both Ti and TiN between the tungsten and the aluminum.

However, it has been found that the tungsten plugs (where tungsten is used to fill an opening, at the window or via level, hereafter referred to collectively as openings, unless otherwise stated) obtained by the CVD deposition process frequently have defects. The source of the defects is not known with certainty, but it is believed that the defects are caused by a reaction of the $WF_6$ precursor gas or some $F_2$-containing species used in the CVD process with the Ti layer in the Ti/TiN composite film. The defects are often called volcanoes, and are undesirable because the Ti/TiN film may peel off and thereby allow tungsten growth on both sides of the film. Adverse effects that may result include blockage or partial filling of the openings so that tungsten deposition does not completely fill the openings where desired, or, in the worst case, formation of tungsten mounds large enough so that there are inadvertent electrical shorts between adjacent openings. These large mounds are called volcanoes because of their morphology. The presence of these defects can reduce device yield.

Various proposals have been made to either solve or alleviate the adverse effects described. For example, a $N_2$ anneal following the Ti/TiN film deposition has been proposed. Alternatively, the thickness of the Ti layer may be reduced. Additionally collimated Ti/TiN layers have been used.

However, these proposals suffer drawbacks. For example, the annealing process can not be used when aluminum interconnects are present because of the relatively high temperature used for the anneal. A reduced Ti thickness may result in poor junction yield, especially in non-salicided junctions, where a non-optimal Ti thickness at the bottom of the window from lack of adequate step coverage, will result in a high contact resistance problem.

SUMMARY OF THE INVENTION

According to the invention, a method of integrated circuit fabrication includes forming tungsten contacts in windows by depositing Ti and TiN layers in windows formed in a patterned dielectric that expose selected conducting portions; for example, of the substrate or of material on the substrate, and sealing TiN grain boundaries prior to tungsten deposition. The conducting portions are under the dielectric layer. Sealing of the TiN grain boundaries prevents attack of the underlying Ti layer by the $WF_6$ used in the CVD tungsten deposition process. In an exemplary embodiment, the grain boundaries are sealed by rinsing in water having at least the ambient temperature. The rinsing may be with or without $CO_2$ bubbling through the water. In another embodiment, the temperature is approximately 80° C. and the time is approximately 10 minutes. In yet another embodiment, the wafer is heated in an oxygen containing environment.

Figure 1:
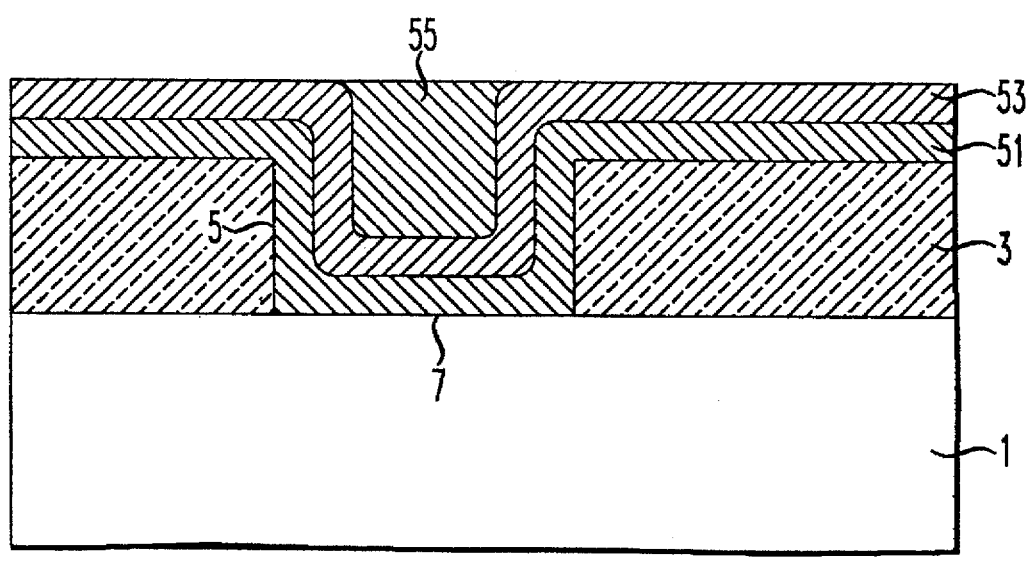
FIG. 1 is a sectional view of a portion of an integrated circuit having a tungsten contact formed according to this invention.

For reasons of clarity, the elements depicted are not drawn to scale.

DETAILED DESCRIPTION

The invention will be described by reference to an exemplary embodiment used to form the contact, which is a portion of an integrated circuit, depicted in FIG. 1. Depicted are substrate 1, dielectric layer 3 which has been patterned to form window 5 which exposes contact area 7 in the substrate. The window thus exposes selected conducting portions of the substrate or of material on the substrate. The conducting portions are under the dielectric layer. The term substrate is used to mean a material that lies underneath and supports another material. The substrate may thus be the silicon wafer, an epitaxial layer on the wafer, or a dielectric layer on which a metal has been deposited. The contact area 7 is conducting although it is to be understood that the window may also expose some nonconducting area. Within window 5 and present on dielectric layer 3 are Ti layer 51, TiN layer 53 and tungsten 55. The substrate 1 may be silicon and the contact areas 7 may be the source/drain regions of a field effect transistor. Alternatively, the contact area may be formed by an aluminum interconnect present on a dielectric layer.

The structure described, except for sealing of the TiN grain boundaries, will be readily formed by those skilled in the art. For example, the windows in the dielectric layer 3 are formed by conventional and well known techniques which need not be further described for those skilled in the art to practice the invention. Conventional and well known techniques are used to deposit the Ti and TiN layers, and well known chemical vapor deposition (CVD) techniques are used to deposit the tungsten.

It has been found that a step that is hypothesized to seal the grain boundaries in the TiN layer prevents the adverse effects described in the Background of the Invention. It is believed that the defects are formed because $WF_6$ or other $F_2$-containing species penetrates the TiN layer and reacts with the underlying Ti. However, all the processes that prevent the adverse effects are consistent with grain boundary sealing. Hence, the invention is described in terms of sealing grain boundaries.

The grain boundaries are sealed by exposure to oxygen; that is, by oxygenating the grain boundaries. This may be done by several embodiments. In one embodiment, the grain boundaries are sealed by rinsing in water. The temperature of the water is at least the ambient temperature. The rinsing is for a period of at least 10 seconds. Elevated temperatures may also be used. For example, a temperature of 80° C. may be used with a rinsing time of approximately 600 seconds. Bubbling $CO_2$ through the water may also be performed. This step appears to improve grain boundary sealing.

In yet another embodiment, the grain boundaries are sealed by heating the wafer in an oxygen containing environment. The oxygen is in relatively low concentration; that is the oxygen concentration may be approximately 2% with the remainder of the atmosphere being an inert carrier gas such as nitrogen. The temperature is desirably between 300° and 500° C. although temperatures outside this range may be used.

After the grain boundaries have been sealed, the CVD tungsten deposition is performed. Convention and now well known deposition techniques may be used. After tungsten deposition has been completed, the remainder of the integrated circuit fabrication is completed. For example, the tungsten is patterned and another dielectric layer is deposited and so forth.

Variations in the embodiments described will be apparent to those skilled in the art. For example, the grain boundaries may be sealed by exposure to oxidizing agents other than oxygen. Additionally, the tungsten may be deposited only in the windows. Furthermore, inert gases other than nitrogen may be used as a carrier gas.

The invention claimed is:

1. A method of integrated circuit fabrication comprising the steps of:

forming a dielectric layer on a substrate;

forming windows in said dielectric layer to expose selected conducting portions under said dielectric layer;

depositing layers of Ti and TiN on said dielectric layer and in said windows;

sealing TiN grain boundaries by rinsing the TiN layer with water; and depositing tungsten on said TiN layer by chemical vapor deposition.

2. A method as recited in claim 1 in which said sealing step comprises rinsing in water having at least ambient temperature.

3. A method as recited in claim 2 in which said rinsing is for at least 10 seconds.

4. A method as recited in claim 2 in which said ambient temperature is approximately 80° C.

5. A method as recited in claim 4 in which said rinsing is for approximately 600 seconds.

6. A method as recited in claim 2 further comprising the step of:

bubbling $CO_2$ through said water.

* * * * *